(12) United States Patent
Schueller et al.

(10) Patent No.: US 7,338,613 B2
(45) Date of Patent: Mar. 4, 2008

(54) SYSTEM AND PROCESS FOR AUTOMATED MICROCONTACT PRINTING

(75) Inventors: Olivier J. A. Schueller, Somerville, MA (US); Amar Kendale, Somerville, MA (US)

(73) Assignee: Surface Logix, Inc., Brighton, MA (US)

( * ) Notice: Subject to any disclaimer, the term of this patent is extended or adjusted under 35 U.S.C. 154(b) by 0 days.

(21) Appl. No.: 09/950,383

(22) Filed: Sep. 10, 2001

(65) Prior Publication Data

US 2003/0047535 A1 Mar. 13, 2003

(51) Int. Cl.
*B44C 1/22* (2006.01)
*B41K 1/38* (2006.01)

(52) U.S. Cl. ............... 216/41; 216/83; 101/327; 101/333; 101/401.1; 205/118

(58) Field of Classification Search ............... 216/41, 216/83; 205/118; 101/327, 485, 385
See application file for complete search history.

(56) References Cited

U.S. PATENT DOCUMENTS

| | | | | |
|---|---|---|---|---|
| 5,259,926 A | * | 11/1993 | Kuwabara et al. | 216/54 |
| 5,512,131 A | * | 4/1996 | Kumar et al. | 438/738 |
| 5,669,303 A | * | 9/1997 | Maracas et al. | 101/327 |
| 5,900,160 A | * | 5/1999 | Whitesides et al. | 216/41 |
| 5,905,007 A | * | 5/1999 | Ho et al. | 430/22 |
| 5,925,259 A | * | 7/1999 | Biebuyck et al. | 216/2 |
| 5,947,027 A | * | 9/1999 | Burgin et al. | 101/474 |
| 6,087,655 A | * | 7/2000 | Kobrin | 250/237 G |
| 6,180,239 B1 | * | 1/2001 | Whitesides et al. | 428/411.1 |
| 6,368,877 B1 | * | 4/2002 | Zhang et al. | 436/527 |
| 6,380,101 B1 | * | 4/2002 | Breen et al. | 438/765 |
| 6,413,587 B1 | * | 7/2002 | Hawker et al. | 427/264 |
| 6,667,360 B1 | * | 12/2003 | Ng et al. | 524/492 |
| 6,887,332 B1 | * | 5/2005 | Kagan et al. | 427/97.3 |
| 2002/0050220 A1 | * | 5/2002 | Schueller et al. | 101/486 |

OTHER PUBLICATIONS

Xia, Y. et al "Microcontact Printing with a Cylindrical Rolling Stamp: A Practical Step Toward Automatic Manufacturing of Patterns with Submicrometer-Sized Features" Advanced Materials 1996, 8 (12) 1015-1017.*
Burgin, T. et al "Large Area Submicrometer Contact Printing Using a Contact Aligner" Langmuir 2000, 16, 5371-5375.*
Xia, Y. et al "Soft Lithography" Angew. Chem. Int. Ed. 1998, 37, 550-575.*
Rogers, J.A. et al "Printing Process Suitable for Reel-to-Reel Production of High-Performance Organic Transistors and Circuits" Advanced Materials 1999, 11 (9) 741-745.*

* cited by examiner

*Primary Examiner*—Anita Alanko
(74) *Attorney, Agent, or Firm*—Kenyon & Kenyon LLP

(57) ABSTRACT

An automated process for microcontact printing is provided, comprising the steps of providing a substrate and a stamp; automatically aligning the substrate and stamp so that the stamp is aligned relative to the substrate to impart a pattern to the substrate at a desired location and with a desired orientation on the substrate; applying an ink to the stamp, the ink including a molecular species adapted to form a self-assembling monolayer (SAM) on the substrate; contacting the stamp and the substrate; and separating the stamp from the substrate.

8 Claims, 3 Drawing Sheets

(a)

(b)

(c)

(d)

(e)

(f)

SYSTEM AND PROCESS FOR AUTOMATED MICROCONTACT PRINTING

FIELD OF THE INVENTION

The present invention relates generally to processes for microcontact printing, and in particular, to automated processes for microcontact printing.

BACKGROUND OF THE INVENTION

Microcontact printing (μCP) is a flexible, non-photolithographic method for forming patterned materials, preferably self-assembled monolayers (SAMs) on a substrate surface. Microcontact printing advantageously permits the generation of patterned SAMs having submicron lateral dimensions.

Microcontact printing has found application in microfabrication processes, such as the manufacture of microelectronic devices, integrated circuits, and computer chips. The capability of microcontact printing to transfer SAM-forming molecular species to a substrate has also found application in patterned electroless deposition of metals and the patterning of proteins on a substrate for improved biological assay techniques. Kind, H., et al., *Langmuir*, 16:6367-73 (Aug. 8, 2000); Bernard, A., et al., *Langmuir*, 14:2226-28 (Apr. 28, 1998) (incorporated herein by reference).

Microelectronic devices have long been prepared by the methods of photolithography. According to this technique, a thin film of conducting, insulating, or semiconducting material is deposited on a substrate and a negative or positive photoresist is coated onto the exposed surface of the material. The resist is then irradiated in a predetermined pattern, and irradiated or non-irradiated portions of the resist are washed from the surface to produce a predetermined pattern of resist on the surface. Photolithography, however, provides limited resolution due to optical diffraction limitations. As a result, increasingly smaller microfabricated structures are too difficult, or too expensive, to manufacture commercially.

Microcontact printing promises a significant advance over conventional photolithographic techniques because of the increased resolution enabled by microcontact printing. Microcontact printing is characterized by extremely high resolution enabling patterns of submicron dimension to be imparted onto a substrate surface. Microcontact printing is also more economical than photolithography systems since it is procedurally less complex and can be carried out under ambient conditions. In addition, microcontact printing permits higher throughput production than other techniques, such as e-beam lithography (a conventional technique employed where higher resolutions are desirable).

Microcontact printing is also more amenable to a wider variety of surfaces that make photolithography an impractical option. For example, microcontact printing may be used on cylindrical or spherical surfaces, or discontinuous or multiplanar surfaces. Because photolithography is a projection technique, a comparatively smaller depth of field prevents its use over non-planar surfaces. Further, photolithography does not permit the patterning of biomaterials, whereas microcontact printing may.

Microcontact printing is not limited by the optical boundaries of photolithography. The principles of microcontact printing are disclosed, for example, in U.S. Pat. No. 5,512,131, incorporated herein by reference. Background information on microcontact printing is also disclosed in Xia, Y. and Whitesides, G. M., "Soft Lithography", *Angew. Chem. Int. Ed.*, 37: 550-575 (1998), incorporated herein by reference. SAMs are generally prepared by exposing a surface to a solution containing a ligand that is reactive towards the surface. A well characterized SAM system is alkanethiolate $CH_3(CH_2)_nS^-$ on gold. In this exemplary SAM, alkanethiols chemisorb spontaneously on the gold surface from solution and form adsorbed alkanethiolates. Sulfur atoms bonded to the gold surface bring the alkyl chains into close contact, leading to an ordered structure. Alkanethiolates with $n>11$ form the closely packed and essentially 2-dimensional organic quasi-crystals supported on gold that characterize the SAMs thus far shown to be most useful in microcontact printing.

Until the present invention, microcontact printing has been carried out entirely, or in part, by hand. The steps necessary to perform microcontact printing using previous methods were difficult, time consuming, and inefficient, making the process less valuable commercially. The few partially automated processes applied to microcontact printing have controlled few parameters (particularly where alignment is concerned), thus restricting the printing process' adaptability to commercial demands. Automated, controlled microcontact printing promises greater control (and hence optimization) of process variables, which in turn promotes higher quality printing and higher throughput. Moreover, the previous methods of performing microcontact printing were dependent on the skill of the operator, leading to variation in the final product. Thus, a need exists for substantially automating the entire process of microcontact printing.

The present invention provides a method of reproducibly and conveniently producing a printed pattern (e.g., a SAM pattern, or variety of SAM patterns), on planar or non-planar surfaces, the method providing patterns having resolutions extending into the submicron range and the process being fully automated and controlled to meet commercial applications.

SUMMARY OF THE INVENTION

An automated process for microcontact printing is provided, comprising the steps of providing a substrate and a stamp; automatically aligning the substrate and stamp so that the stamp is aligned relative to the substrate to impart a pattern to the substrate at a desired location and with a desired orientation on the substrate; applying an ink to the stamp, the ink including a molecular species adapted to form a self-assembling monolayer (SAM) on the substrate; contacting the stamp and the substrate; and separating the stamp from the substrate. An automated process for microcontact printing wherein the steps are effectuated in the order described above.

A system for automated microcontact printing is provided, comprising:
a. a stamping device including at least one stamp;
b. an aligning device configured to align the stamp with a substrate to impart a pattern to the substrate at a desired location on the substrate; and
c. an inking device arranged and configured to apply an ink to the stamp, the ink including a molecular species adapted to form a self-assembling monolayer (SAM) on the substrate;
wherein the inking device is configured to apply ink to the stamp, the aligning device is configured to align the stamp and the substrate and the stamping device is configured to cause the stamp to contact the substrate and impart the pattern of the molecular species to the substrate, and separate the stamp from the substrate.

An automated process for microcontact printing is provided, comprising the steps of:

a. providing a substrate and a stamp;
b. automatically aligning the substrate and stamp so that the stamp is aligned to impart a pattern to the substrate at a desired location and with a desired orientation on the substrate, the alignment step including the substep of controlling six degrees of freedom defining movement of at least one of the stamp and the substrate in three-dimensional space;
c. applying an ink to the stamp, the ink including a molecular species adapted to form a self-assembling monolayer (SAM) on the substrate;
d. contacting the stamp and the substrate for a predetermined period of time to form a contact surface, the contacting step including the substep of automatically controlling an applied force, the applied force permitting localized pressure differences on the contact surface; and
e. separating the stamp from the substrate after the expiration of the pre-determined period of time.

Steps a, b, c, d, and e may be effectuated in that order.

BRIEF DESCRIPTIONS OF THE DRAWINGS

BRIEF DESCRIPTION OF THE INVENTION

Figure 1:
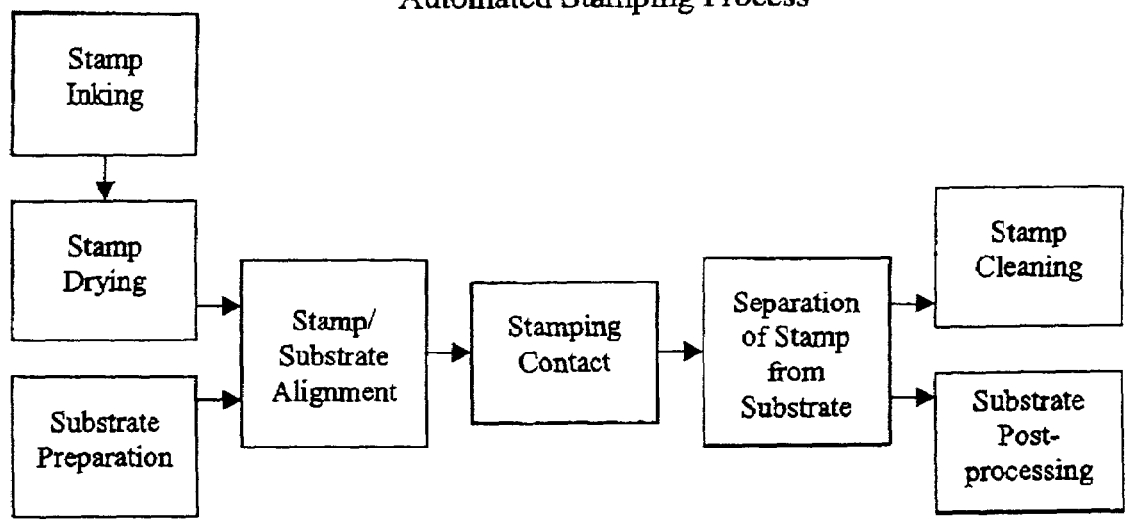
FIG. 1 is a block diagram illustrating one embodiment of the automated system of the invention.

According to the invention, an automated process is provided for microcontact printing wherein a stamp transfers a patterned material to a substrate surface. FIG. 1 sets forth a block diagram illustrating certain steps of one embodiment of the process of the invention.

A stamp is provided for patterning a substrate surface. The stamp may be formed in conventional fashion, as readily understood by those skilled in the microcontact printing art. For example, a stamp useful for microprinting may be fabricated by molding and curing a material onto a surface presenting a surface relief. A stamp may also, for example, be fabricated by ablating a material in a manner that generates a surface relief on the material's surface. The stamp may be fabricated from any material allowing precise, reproducible, efficient microcontact printing, but preferably the material meets certain physical characteristics.

The material of the stamp is preferably chosen to be elastic, such that the stamping surface may closely conform to minute irregularities in the surface of the substrate so as to promote the complete transfer of the ink thereto. As understood herein, the term "ink" means the fluid that is applied to the stamp and thereafter delivered by way of contact with the substrate, to the substrate surface. The stamp may preferably not be so elastic that when it is contacted against a substrate surface, the surface features of the stamp deform to the extent that blurring of the ink pattern results on the substrate surface. For a stamp made from polydimethylsiloxane (PDMS), for example, a modulus of elasticity may be about 2.5 MPa. A higher modulus of elasticity may be provided (such as about 10 MPa) wherein the stamp is prepared from a material containing additional vinyl groups. A higher modulus of elasticity may be provided for generating sub-micron features.

The stamp may also be formed from a material that permits the transfer of the ink or material to be patterned. Preferably, the stamp material allows adsorption of self-assembling monolayer (SAM)-forming molecular species or adsorbs the molecular species dissolved or suspended in a carrier solvent. The stamp preferably permits SAM-forming molecular species to be transferred to a substrate surface to form a SAM thereon. The swelling and adsorbing characteristics of the stamp material may be important in providing the desired definition of a SAM patterned on the substrate surface.

Additionally, a stamp may be fabricated such that the stamping surface is free of any leachable materials, such as plasticizers, that would interfere with or contaminate the SAM-forming molecular species. Material selected for use on the fabrication of the stamp is also preferably selected so that it does not undergo substantial shape changes during or after stamp formation.

The stamp may be fabricated from a polymeric material. Polymeric material suitable for use in fabrication of the stamp may have linear or branched backbones, and may be cross-linked or non cross-linked, depending upon the particular polymer and the degree of formablilty desired of the stamp. Greater cross-linking results in comparatively stiffer (i.e., less deformable) material. A variety of elastomeric polymeric materials are suitable for such fabrication, especially polymers of the general classes of silicone polymers, epoxy polymers and acrylate polymers.

An example of a silicone elastomer is polydimethylsiloxane. PDMS polymers manufactured by Dow Chemical Company (Midland, Mich.) are commercially available under the trade name Sylgard®.

The stamp may also be fabricated from a composite material having a filler dispersed in a polymeric matrix. Fillers may be employed to adjust the mechanical, optical, thermal, or magnetic properties of the stamp material. Typical fillers include silica particles, titania particles, and other metal oxide particles, as well as carbon black, or carbon powders.

The stamping surface of the stamp is preferably characterized by the presence of indentations (troughs) and raised portions (peaks) as shown in FIG. 2(a). Preferably, only the raised portions of the stamping surface may contact the substrate to which a pattern is to be imparted. Raised portions on the stamp may have a lateral dimension ranging from as large as desired to less than a micron. Raised portions having lateral dimensions less than about 100 nm have been fabricated.

The geometry of the stamp is selected for the particular substrate and/or automated process. The stamp may be flat, roller-shaped, cylindrical, tubular, hemispherical (wherein the pattern is on the external surface of the hemisphere), inverted hemispherical (wherein the pattern is on the internal surface of the hemisphere), or the stamp may be multi-faceted, such as a two-sided stamp. The integrity of the stamp may be reinforced, for example, with the affixation of a rigid or semi-rigid backing to ensure dimensional stability. The stamp may include a thin film deposited onto a surface (such as glass, for example) to function as the stamping surface. The stamp may also be discontinuous, in that the stamping surface actually includes more than one distinct stamp area arranged on the stamping surface.

Figure 2:
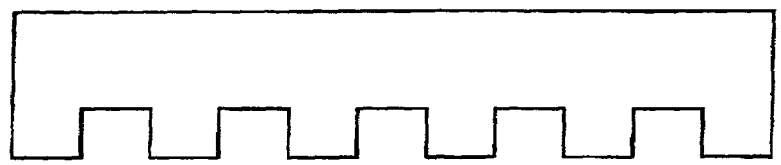
FIG. 2 shows (a) a stamp having indentations and raised portions; (b) the stamp of (a) further having a rigid backing; (c) a cross-section of a stamp having through-holes; (d) the stamp of (c) having a rigid backing also containing through-holes; (e) a stamp having non-uniform surface relief and having a rigid backing; and (f) a stamp having non-uniform surface relief.
Figure 2:
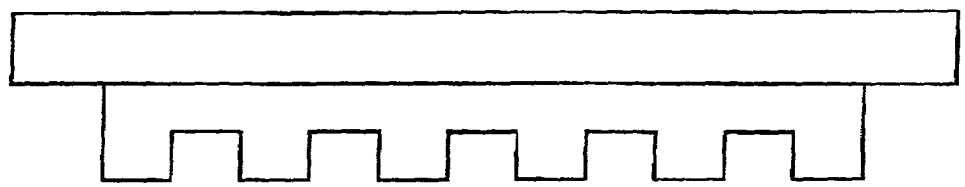
Figure 2:
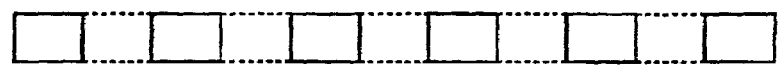
Figure 2:
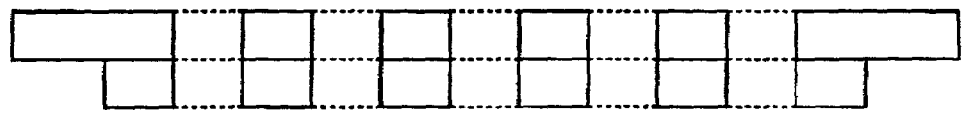
Figure 2:
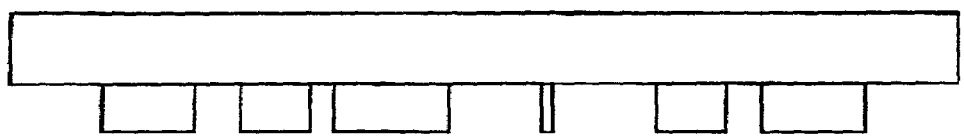
Figure 2:

Other representative stamping substrates are shown in FIG. 2. In FIG. 2(b), a stamp of FIG. 2(a) is shown having a rigid backing. Stamps having through-holes in their design are shown in FIGS. 2(c) and (d), with the stamp of (d) further having a rigid backing. FIGS. 2(e) and (f) show a stamp having non-uniform surface relief, with the stamp of (e) having a rigid backing.

In accordance with the present invention, a substrate material is provided to which a desired pattern is imparted by the stamp. The substrate of the present invention may be any suitable electrically conductive, electrically non-conductive, or electrically semi-conductive material that can form a solid phase at room temperature. In one embodiment, the substrate material must allow formation of the pattern of ink, or material to be patterned, by covalently binding a functional group, for example, a terminal functional group, from the SAM-forming molecular species deposited onto the substrate surface by the stamp. The substrate may include, for example, a metallic film on a polymeric, glass, or ceramic substrate, a metallic film on a conductive film(s) on a polymeric substrate, metallic film(s) on semiconducting film(s) on a polymeric substrate, or multi-layered substrates with an outer layer capable of forming and supporting SAMs.

In the automated microcontact printing process of the present invention, the substrate may move to contact the stamp or the stamp may move to contact the substrate. In another example embodiment of the present invention, both the stamp and the substrate may be moved into contact with one another.

Whether the substrate and/or the stamp is moved, the movement may be accomplished by any linear and/or rotational stages such as, for example, by a conveyor belt, reel-to-reel process, directly-driven moving fixtures or pallets, chain, belt or gear-driven fixtures or pallets, a moving cart, a frictional roller, or a rotary apparatus (e.g., turntable).

According to a process of the present invention, a stamp is automatically oriented (aligned) in a desired configuration relative to the substrates. Alternatively, the substrate may be automatically oriented in a desired or preset configuration relative to the stamp.

Figure 3:
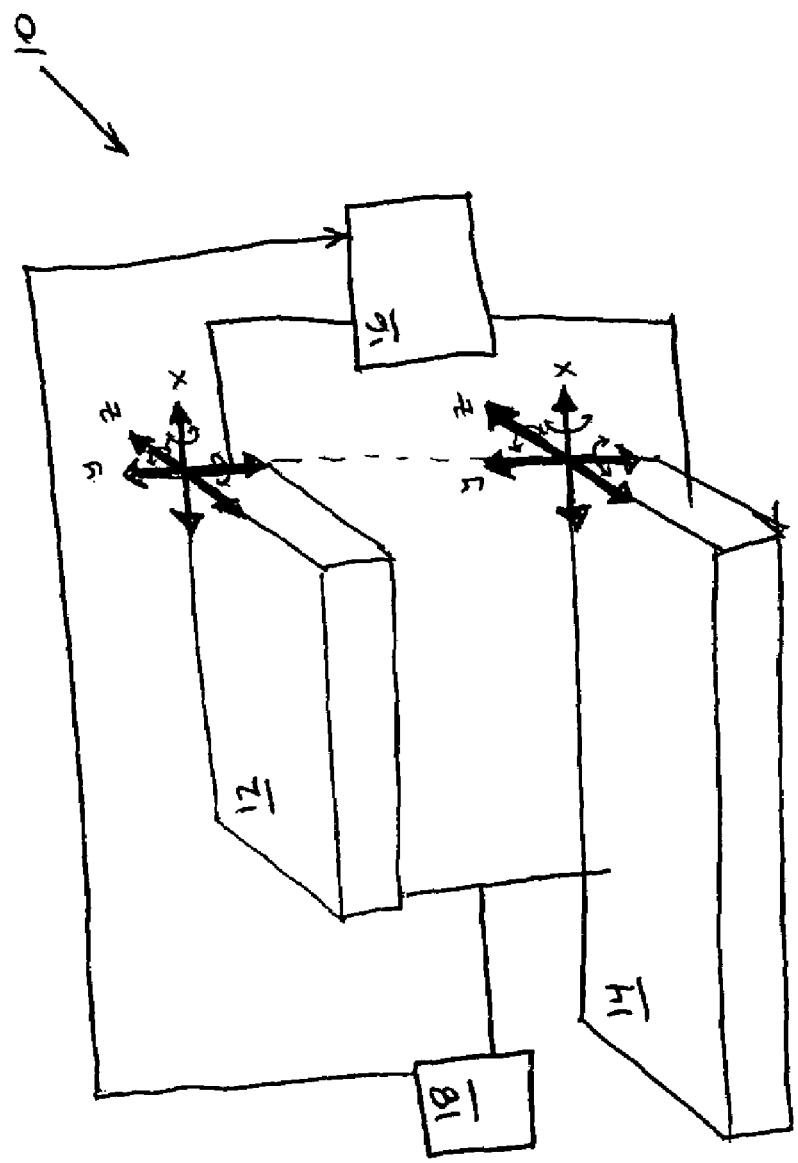
FIG. 3 is a schematic diagram that shows a system in which an automated controller automatically controls the movement and alignment of a stamp and a substrate, in accordance with one embodiment of the present invention.

In the automated microcontact printing process of the present invention, precise, accurate, high resolution printing is accomplished by automatically controlling the alignment of stamp and substrate, particularly by controlling the six degrees of freedom afforded the stamp and/or substrate in 3-dimensional space. The six degrees of freedom in three-dimensional space include movement in the planes defined by x, y, and z axes, and angular rotation about any such axis. FIG. 3 illustrates one embodiment of the present invention in which a system 10 is provided which includes an automated controller 16 configured to automatically control the movement and alignment of a stamp 12 relative to a substrate 14 by moving the stamp 12 and/or the substrate 14 in any direction, e.g., in the planes defined by x, y, and z axes and/or by angular rotation about any such axis, relative to each other. The automated controller 16 may, in one embodiment, be configured to control the automatic movement and alignment of the stamp 12 relative to the substrate 14 in response to feedback data obtained by a feedback system 18 from the stamp 12 and/or the substrate 14. Passive or active alignment devices may be employed to provide control over each degree of freedom for the stamp and/or substrate.

Passive alignment mechanisms appropriate for the present invention include alignment pins or pads, flexural alignment stages, spring-loaded contacts, etc. Active alignment mechanisms appropriate for the present invention may incorporate sensors and actuators. Known sensors useful for position sensing include capacitive, inductive, linear variable differential transform, photoelectric, laser interferometric, other proximity sensors, etc. Sensors useful for force sensing include load cells, spring scales, and voice coils. Sensors may also be employed for alignment via small feature characterization, such as cameras coupled to image processing software, or microscopy.

Active alignment may be accomplished by coupling sensors and actuators, along with control logic, to create a feedback system. Actuators include linear and rotary motors, voice coils, pneumatic and hydraulic systems, piezoelectric elements, etc. The alignment system of the invention may preferably also incorporate a bearing system to guide the actuated motion of the stamp or substrate. Exemplary bearing systems utilize air, magnetic forces, or hydrostatic force. Mechanical bearings may also be used, and include (for example) crossed-rollers, bushings, sliding contact bearings, ball bearings, or flexural bearings.

In the automated process of the invention, some or all six degrees of freedom of movement of stamp and/or substrate may be controlled, thus promoting accuracy and resolution in the pattern transfer regardless of stamp/substrate geometry (topology) or pattern complexity.

Further in accordance with a preferred embodiment of the present invention, ink is applied to a stamp in preparation for stamping (printing). In the microcontact printing process of the invention, the ink preferably contains at least one molecular species that is able to form a SAM on the substrate surface. The ink may include a solvent in which the SAM-forming molecular species is dissolved.

An ink composition useful in the process of the invention may include a thiol dissolved in a solvent carrier, although neat thiol may be employed. For example, it is preferable that a chosen solvent not significantly absorb into a PDMS substrate to which the ink is applied. A solvent carrier may have a high vapor pressure to permit its easy dissipation (evaporation) from a stamp. Generally, a solvent employed in an ink formulation useful in the invention may exhibit an advancing contact angle less than 90 degrees; for example, less than 30 degrees. Solvent carriers may include, but are not limited to, methanol, ethanol, 1-propanol, 2-propanol, water, DMF, DMSO, and mixtures thereof. Additionally, aqueous mixtures of ethanol/acetic acid may be used, as well as buffered solutions.

Appropriate thiols to be used in an ink include linear thiols (preferably $C_2$-$C_{40}$, more preferably $C_8$-$C_{20}$), branched thiols, and substituted thiols functionalized with either electrophilic or nucleophilic groups. Thiols employed may be saturated or unsaturated, polar or non-polar, aromatic or aliphatic, or heterocyclic, and contain hydrophobic, hydrophilic, or charged groups.

Exemplary ink compositions that may be employed in the practice of the invention include 1 mM hexadecane thiol in ethanol or 1 mM 11-mercapto-1-undecanoic acid in ethanol. The thiol is generally present in the solvent in concentrations ranging from about 0.5 mM to about 20 mM, and preferably from about 1 mM to about 10 mM.

Ink may be applied to the stamp by different methods known to those skilled in the art. For example, the stamp may be immersed in an ink bath, the ink may be sprayed onto the stamp, the ink may be applied to the stamp via vapor deposition, a sponge or any other impregnated ink carrier system may be used, or a spreading mechanism (e.g., a squeegee) may be used.

Depending on the particular application, the stamp may be desirably pre-treated before ink is applied to the stamp. For example, non-crosslinked oligomers/monomers, or any catalysts, may be extracted from the stamp using an appropriate solvent, such as $CH_2Cl_2$ or $CHCl_3$. The surface of the stamp may also be oxidized by exposure to an oxygen-containing plasma. Oxidizing the stamp's surface promotes hydrophilicity and improves the printing of those molecules presenting hydrophilic and/or charged groups (such as carboxy-terminated thiols or proteins).

A substrate to be employed in the process of the invention may also be pre-treated and/or activated. Possible substrate pre-treatment methods include, but are not limited to, cleaning with dilute aqua regia, UV exposure, ultrasonic bath, and cleaning with a non-polar solvent (such as hexane) followed by a polar organic solvent (such as ethanol). An exemplary substrate pretreatment may include a washing cycle of heptane, ethanol, water, and ethanol, followed by blow drying.

After the ink has been applied to the stamp surface, the stamp surface is then dried if required for the particular ink. Optionally, inks may be employed that do not require drying prior to stamping. Drying may be accomplished with gas jet(s), using for example, a nitrogen gas stream. Drying may also be accomplished with the use of elevated temperatures in the proximity of the stamp to evaporate organic solvent. A decrease in air pressure in the proximity of the stamp, or a vacuum chamber, may be employed to facilitate the evaporation of volatile solvents. Further, a flat elastomeric block may be pressed into contact with the stamp, or vice versa. Additionally, absorbent material may instead be pressed into contact with the stamp, or vice versa. A "dried" stamp means that extra ink has been removed from the stamp surface, and the carrier or solvent (if present) has been removed, such that the ink to be used in the printing process remains adsorbed to the stamp material.

In accordance with the process of the present invention, the properly aligned stamp is then contacted with the properly aligned substrate. The contact of the stamp with the substrate may be accomplished, for example, by displacing one of the stamp and the substrate relative to the other of the stamp and the substrate, by a pneumatic device, a hydraulic device, a mechanical device, an electric or electronic device, an electro-mechanical device (including a piezoelectric device), a magnetic device, etc., or by combinations of these devices.

The stamp contacts the substrate so that the surface of the stamp having ink applied thereto is in contact with the surface of the substrate that is to receive the ink. The stamp and substrate may be aligned to accomplish the desired contact between the stamp and the substrate. As a general rule, the shorter the contact time between the stamp and the substrate, the better the resolution of the printed indicia. The longer the contact time between the stamp and the substrate, the more likely the diffusion of ink onto the substrate surface will promote the undesirable blurring of the intended printed pattern.

A key factor determinative of a complete pattern transfer from stamp to substrate may be the uniformity of pressure exerted on the stamp (and/or the substrate) Pressure distribution across the stamping surface may be substantially uniform so that any applied force enabling stamp/substrate contact does not favor one localized region of the contact surface over another. However, certain printing applications or patterns may favor localized pressure differentials to accommodate localized differences in pattern geometry, stamp geometry, or substrate geometry. In such case, the automated conveyance mechanism may permit prescribed differential pressures across the contact surface, whether that surface be on the stamp, the substrate, or both. This may be accomplished with a distributed arrangement of actuators and/or sensors. The distribution of pressure preferably precludes the formation of air bubbles between the stamp and substrate surfaces and minimizes the deformation of the stamp (and/or substrate).

Another key factor may be the force applied to the stamp and/or substrate. Too much force will promote unacceptable levels of stamp deformation (and inaccurate, low resolution pattern transfer), and too little force will prevent a complete pattern transfer. Accordingly, the automated process of the present invention precisely controls the pressure exerted on the stamp and/or substrate, while permitting, if necessary, localized pressure differences.

Contact time between the substrate and stamp is dependent upon, among other things, the physical properties of the ink and the desired resolution. Generally, a contact time may be in the range of about 1 second to about 300 seconds, e.g., in the range of about 1 second to 30 seconds, or in the range of about 3 seconds to about 5 seconds. Higher resolution (imparting smaller features) may require shorter contact times (about 1-5 seconds) to prevent ink diffusion.

Contact time is also dependent upon the surface geometry of the stamp and substrate. As is the case for any stamp-substrate geometry, the contact time between stamp and substrate is longer than the time allowed for transfer of SAM-forming molecules to substrates in areas being printed. In the case of roll printing, or printing on a cylindrical substrate, the pattern is formed sequentially (not at once) and the stamp is also removed in sequential fashion.

In further accordance with the present invention, the stamp is thereafter separated from the substrate after the stamping process. The separation of the stamp may be accomplished with the use of ejector pins, gas jet(s), liquid jets, or a peeling mechanism, by which the stamp is sequentially removed from the substrate, or vice versa. The separation of the stamp may also be accomplished with the use of a pneumatic device, a hydraulic device, a mechanical device, an electric or electronic device, an electro-mechanical device (including a piezoelectric device), a magnetic device, etc., or by combinations of these devices.

The automated microcontact printing process of the present invention may further include post-stamping process steps. For example, the substrate may further be subjected to post-processing such as etching (or orthogonal etching), as readily understood and practiced by those skilled in the art.

Examples of metal etchants include:

FF. Au etchants
1. Aqueous solution of $Fe(CN)_6^{-3}/Fe(CN)_6^{-3}/S_2O_3^{-2}$ (0.1M/0.01M/0.1M) in 1M KOH.
2. $CN^-/O_2$ solution
3. (For use with GaAs substrate): 10:1:1 (v:v:v) of 5% (w/v) thiourea, 15% (v:v) $H_2O_2$ and 6N HCl at 35° C.

GG. Ag etchant
1. $Fe(CN)_6^{-3}/Fe(CN)_6^{-3}/S_2O_3^{-2}$ (0.1M/0.01M/0.1M) (aqueous solution)

HH. Al etchant
1. Transene Aluminum etchant type "A" (commercially available)
2. Phosphoric acid/acetic acid/nitric acid/water (16:1:1:2)

II. Cu etchant
1. FeCl$_3$ (0.012 M)
2. FeCl$_3$ (0.012 M) and HCl (0.4-0.8 M)
3. FeCl$_3$ (0.012 M) and NH4Cl (0.4-0.8 M)

A selected etching process is dependent upon the substrate surface material not protected by SAMs. Additionally, before or after etching, the substrate may be subjected to an additional stamping step (or steps) wherein the same stamp is contacted with the substrate or a different stamp bearing a different pattern, is contacted with the substrate. It is further contemplated that post-stamping processes may include additive processes, wherein material is deposited onto the areas of the substrate having already received printing, areas of the substrate not printed upon, or both.

Post-stamping treatment may include the formation of SAM in complementary regions (those regions not stamped) of the substrate. This may be achieved by exposing the substrate surface to a solution of secondary SAM-forming molecules. The substrate is thereafter post-treated with a rinse of oligo-ethyleneglycol-terminated thiol or an oligo-ethyleneglycol disulfide. The period of exposure of the secondary thiol is in the range of about 1 µs to about 24 hours, as some thiols and disulfides require longer times to form perfect SAMs. The substrate surface may also be exposed to gaseous thiol molecules.

The process of the invention may be carried out in a serial, batch, or continuous mode. In the serial mode, one substrate is processed at a time. In the batch mode, each process step is carried out on more than one substrate at a time. In the continuous mode, process steps are continuously executed on a continuous "supply" of substrate.

Following the stamping process, the substrate may be inspected for quality assurance and quality control purposes. This may be accomplished visually (via microscopy, such as scanning electron microscopy and chemical atomic force microscopy), via test metrology, etc. Continuity testing (electrical) may be undertaken for quality assurance purposes. Optical integrity testing includes tests for substrate reflectivity, transparency, ellipsometry, (if the substrate is transparent) surface plasmon resonance, etc. Quality assurance may be tested, for example, via camera (CCD) imaging, contact angle determination, microscopy, etc.

During the application of the ink to the stamp, the stamping itself, and the post-stamping stages, the process environment may be controlled. Temperature affects the thermal expansion of PDMS, the rates of chemical reactions and the evaporation of solvent carrier. Humidity control may be particularly important if silanes are being stamped on oxide surfaces. The concentration of particulate matter in the air affects printing fidelity and the rate at which defects occur. The air pressure in the printing environment affects the rate of solvent evaporation. Further, the extent of apparatus vibration also affects printing fidelity and the rate at which defects occur.

Conventional methods may be employed to control environmental variables. Temperature control may be achieved by using, for example, resistive heating or cooling with refrigeration. Pressure may be controlled with positive or negative gas flow into or out of a sealed chamber. Humidifiers and/or dehumidifiers may be used to control humidity. Particulate contamination may be minimized by maintaining a clean-room environment that incorporates air filtration and a sealed chamber.

The process of the present invention may be carried out at ambient conditions of room temperature and atmospheric pressure. Alternatively, the process may be carried out at temperatures and pressures above or below ambient temperature and atmospheric pressure, if necessary for the particular microcontact printing process being carried out. For example, printing may be carried out at lower temperatures wherein stamp features contract, so as to promote the generation of smaller features amenable to sub-micron printing. Environmental regulation may be accomplished with sensors, actuators, and processors that provide closed-loop control over the environmental parameters.

The automated microcontact printing process of the present invention may include process controls and the systems may be regulated by electronic control. Each individual step in the process may be controlled in whole or in part by a centralized or distributed control system. For example, the rate at which substrate is conveyed to the stamp (or vice versa) may be carefully controlled. Also for example, the time and pressure at which the stamp is brought into contact with the substrate may be controlled. Controls may also insure that the proper amount of ink is delivered to the stamp.

Feedback controls may be used to regulate such process parameters as contact alignment, translation/trajectory, stamping pressure, temperature, pressure, ink concentration in solution, stamp "dryness", apparatus vibration, etc.

The automated controls may include open loop control (automatic repeat cycle), closed loop control (self-measuring and adjusting feedback), and/or adaptive control (automatic cognition employing mathematical algorithms). The control systems employed may include, but not be limited to, human-interface tools (e.g., display, keyboard, touch screens, and control panels); processing units, such as microprocessors running on software designed for the automated process of the invention; and data acquisition apparati, such as DAQ boards and modules, and associated software.

The foregoing has been a description of various example embodiments of the invention. Those skilled in the art would readily appreciate that all parameters listed herein are meant to be exemplary and actual parameters may depend upon the specific application for which the methods and apparatus of the present invention are being used. Modifications and additions to the invention may be made without departing from the spirit and scope of the invention. It is, therefore, to be understood that the foregoing embodiments are presented by way of example only and not to otherwise limit the scope of the invention. Within the scope of the claims and equivalents thereto, the invention may be practiced other than as specifically described.

What is claimed is:

1. An automated process, comprising the steps of:
   a. providing a substrate and a stamp;
   b. automatically aligning the substrate and stamp so that the stamp is aligned to impart a pattern to the substrate at a desired location and with a desired orientation on the substrate, the alignment step including the substeps of controlling six degrees of freedom defining movement of at least one of the stamp and the substrate in three-dimensional space;
   c. applying an ink to the stamp, the ink including a molecular species adapted to form a self-assembling monolayer (SAM) on the substrate;
   d. contacting the stamp and the substrate for a predetermined period of time to form a contact surface, the contacting step including the substep of using a force sensor to generate feedback data for automatically controlling the movement of an actuator, the movement of the actuator providing an applied force that, based on the feedback data, permits localized pressure differences on the contact surface to accommodate local differences in geometry;

e. separating the stamp from the substrate after the expiration of the pre-determined period of time; and f. performing a post-processing step after the stamping process.

2. The process of claim 1, wherein the post-processing step includes the substep of etching the substrate.

3. The process of claim 1, wherein the post-processing step includes an additive process.

4. An apparatus for automated microcontact printing, comprising:

a stamping device including at least one stamp, the stamp fabricated from a composite material, wherein the composite material has a filler dispersed in a polymeric matrix;

an aligning device including a feedback system, the aligning device configured to automatically align the stamp with a substrate to impart a pattern to the substrate at a desired location on the substrate; and an inking device arranged and configured to apply an ink to the stamp, the ink including a molecular species adapted to form a self-assembling monolayer (SAM) on the substrate; and a force sensor configured to generate feedback data for controlling the movement of the stamping device;

wherein the inking device is configured to apply ink to the stamp, the aligning device is configured to align the stamp and the substrate and the stamping device is configured to cause the stamp to contact the substrate via an applied force that, based on the feedback data generated by the force sensor, permits localized pressure differences on a contact surface to accommodate local differences in geometry, and impart the pattern of the molecular species to the substrate, and separate the stamp from the substrate.

5. The apparatus of claim 4, wherein the filler is employed to adjust at least one of a mechanical, optical, thermal, and magnetic property of the stamp material.

6. The apparatus of claim 4, wherein the filler includes at least one of silica particles, titania particles, metal oxide particles, carbon black, and carbon powders.

7. The process of claim 1, wherein the post-processing step includes an additive process so as to deposit material onto at least one of an area of the substrate having already received printing and an area of the substrate not printed upon.

8. The process of claim 1, wherein the post-processing step includes an inspection procedure which is performed at least one of visually, by microscopy, by scanning electron microscopy, by chemical atomic force microscopy, via test metrology, by continuity testing, electrically, via optical integrity testing, by substrate reflectivity, transparency, ellipsometry, surface plasmon resonance, via camera (CCD) imaging, contact angle determination, and microscopy.

* * * * *